(12) United States Patent
Watanabe

(10) Patent No.: US 8,262,917 B2
(45) Date of Patent: Sep. 11, 2012

(54) FABRICATING METHOD FOR MULTILAYER PRINTED CIRCUIT BOARD

(75) Inventor: Ryoichi Watanabe, Sakai (JP)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1212 days.

(21) Appl. No.: 12/076,431

(22) Filed: Mar. 18, 2008

(65) Prior Publication Data
US 2009/0014411 A1    Jan. 15, 2009

(30) Foreign Application Priority Data

Jul. 10, 2007 (KR) .................. 10-2007-0069275

(51) Int. Cl.
*B05D 5/12* (2006.01)
*H01B 13/00* (2006.01)
(52) U.S. Cl. .................. 216/18; 427/99.5
(58) Field of Classification Search .................. None
See application file for complete search history.

(56) References Cited

U.S. PATENT DOCUMENTS

| | | | | |
|---|---|---|---|---|
| 6,440,566 | B1 * | 8/2002 | Maligie et al. | 428/412 |
| 6,808,642 | B2 * | 10/2004 | Takaya et al. | 216/13 |
| 7,707,715 | B2 * | 5/2010 | Okabe et al. | 29/846 |
| 7,836,590 | B2 * | 11/2010 | Mok et al. | 29/852 |
| 2009/0011220 | A1 * | 1/2009 | Park et al. | 428/317.5 |
| 2009/0013525 | A1 * | 1/2009 | Mok et al. | 29/831 |
| 2009/0014411 | A1 * | 1/2009 | Watanabe | 216/18 |
| 2009/0056119 | A1 * | 3/2009 | Okabe et al. | 29/846 |
| 2010/0024212 | A1 * | 2/2010 | Okabe et al. | 29/852 |

FOREIGN PATENT DOCUMENTS

| | | |
|---|---|---|
| JP | 9-148745 | 6/1997 |
| JP | 11-274727 | 10/1999 |
| JP | 2001-284813 | 10/2001 |
| JP | 2005-202104 | 7/2005 |
| JP | 2005-244140 | 9/2005 |
| JP | 2005-294053 | 10/2005 |
| JP | 2006-60150 | 3/2008 |

OTHER PUBLICATIONS

Japanese Office Action issued May 18, 2010 in corresponding Japanese Patent Application 2008-073639.
Japanese Office Action issued May 10, 2011 in corresponding Japanese Patent Application 2008-073639.

* cited by examiner

*Primary Examiner* — Allan Olsen

(57) ABSTRACT

A fabrication method for a multilayer printed circuit board includes: forming a first circuit-forming pattern and a first insulation layer, into which the first circuit-forming pattern is inserted, on a first carrier; forming inner circuit patterns and inner insulation layers over the first insulation layer, and forming inner vias connecting the inner circuit patterns positioned on different insulation layers; forming a second circuit-forming pattern on a second carrier and inserting the second circuit-forming pattern into a second insulation layer on an outermost side; removing the first carrier and the second carrier; forming circuit-forming grooves by removing the first circuit-forming pattern and the second circuit-forming pattern, and forming via-forming indentations connected with the circuit-forming grooves; and forming outer circuit patterns and outer vias by filling the circuit-forming grooves and the via-forming indentations with a conductive material. This can provide a thin printed circuit board having high reliability and fine-lined circuits.

28 Claims, 29 Drawing Sheets

FABRICATING METHOD FOR MULTILAYER PRINTED CIRCUIT BOARD

CROSS-REFERENCE TO RELATED APPLICATIONS

This application claims the benefit of Korean Patent Application No. 10-2007-0069275 filed with the Korean Intellectual Property Office on Jul. 10, 2007, the disclosure of which is incorporated herein by reference in its entirety.

BACKGROUND

1. Technical Field

The present invention relates to a fabricating method for a multilayer printed circuit board.

2. Description of the Related Art

With electronic devices being geared towards higher functionalities and smaller sizes, the need is increasing for enhancing the functions of circuit components and increasing package density. There is also a need for improving the module to which the circuit components are joined, for increasing package density and functionality. The current trend is to mount the circuit components on a circuit board having a multilayer structure, so that the package density may be improved. In particular, the multilayer printed circuit board that uses connection by inner vias is commonly utilized as a means for increasing circuit density. Furthermore, the component-integrated circuit board is being developed, in which wiring patterns connect the mounting area with the LSI areas or the components by as short a distance as possible to reduce space.

With the printed circuit board continuously becoming lighter, thinner, and simpler, the width and pitch of the circuit patterns are reaching values lower than 50 μm and even 25 μm. In such conditions of minute values, however, the circuit patterns are subject to becoming detached during the processing procedures, which can lower production yield, while bending and warpage, etc., can occur in the board. There may also be other problems affecting reliability, such as problems in migration resistance and heat resistance after moisture absorption, etc.

SUMMARY

An aspect of the invention is to provide a method of fabricating a thin multilayer printed circuit board.

Another aspect of the invention is to provide a fabrication method for a multilayer printed circuit board, which enables fine-lined circuits while providing high reliability.

One aspect of the invention provides a method of fabricating a multilayer printed circuit board, which includes: forming a first circuit-forming pattern and a first insulation layer, into which the first circuit-forming pattern is inserted, on a first carrier; forming inner circuit patterns and inner insulation layers over the first insulation layer, and forming inner vias connecting the inner circuit patterns positioned on different insulation layers; forming a second circuit-forming pattern on a second carrier and inserting the second circuit-forming pattern into a second insulation layer on an outermost side; removing the first carrier and the second carrier; forming circuit-forming grooves by removing the first circuit-forming pattern and the second circuit-forming pattern, and forming via-forming indentations connected with the circuit-forming grooves; and forming outer circuit patterns and outer vias by filling the circuit-forming grooves and the via-forming indentations with a conductive material.

Another aspect of the invention provides a method of fabricating a multilayer printed circuit board, which includes: forming a first circuit-forming pattern and a first insulation layer, into which the first circuit-forming pattern is inserted, on a carrier; forming inner circuit patterns and inner insulation layers over the first insulation layer, and forming inner vias connecting the inner circuit patterns positioned on different insulation layers; forming a second circuit-forming pattern on a second insulation layer on an outermost side, and inserting the second circuit-forming pattern into the second insulation layer; removing the carrier; forming circuit-forming grooves and via-forming indentations connected with the circuit-forming grooves, by removing the first circuit-forming pattern and the second circuit-forming pattern; and forming outer circuit patterns and outer vias by filling the circuit-forming grooves and the via-forming indentations with a conductive material.

The method of fabricating a multilayer printed circuit board according to certain embodiments of the invention may include one or more of the following features. For example, at least one of the first circuit-forming pattern and the second circuit-forming pattern can be formed from a dissolvable material, such as a water-soluble resin. The first circuit-forming pattern and/or the second circuit-forming pattern can also be formed from a detachable photosensitive resist.

At least one of the first carrier and the second carrier can be formed from any one of a tape, a film, and a sheet, and can be removed by detaching. Also, the first circuit-forming pattern and/or the second circuit-forming pattern can be formed from a metal foil, and can be removed by etching. The carrier can be any one of a tape, a film, and a sheet, and can be removed by detaching, or can be made from a metal foil, and can be removed by etching.

The conductive material filled in the circuit-forming grooves and the via-forming indentations may be filled in by plating. The method of fabricating a multilayer printed circuit board can further include removing a portion of the conductive material by a leveling process, after the conductive material is filled in. Also, after the leveling process, a solder resist can be formed on at least one of the first insulation layer and the second insulation layer, and openings can be formed such that the outer circuit patterns are revealed.

The inner circuit patterns can be formed by pressing inner-circuit-forming patterns formed on the inner insulation layers, such that the inner-circuit-forming patterns are inserted into the inner insulation layers, and then removing the inner-circuit-forming patterns; and filling a conductive material in circuit-forming grooves formed by removing the inner-circuit-forming patterns. The inner vias can be formed by processing via-forming indentations connected with the inner circuit patterns in the circuit-forming grooves, and then filling a conductive material in the via-forming indentations.

Forming the first circuit-forming pattern on the first carrier may include detachably securing a pair of the first carriers to each other and forming the first circuit-forming pattern on each of the first carriers. Forming the first circuit-forming pattern on the carrier may include detachably securing a pair of the carriers to each other and forming the first circuit-forming pattern on each of the carriers.

Yet another aspect of the invention provides a method of fabricating a multilayer printed circuit board, which includes: forming a first circuit-forming pattern and a via-forming pattern on a first carrier, and forming a first insulation layer; repeatedly forming inner circuit patterns and inner insulation layers over the first insulation layer by processes of forming circuit-forming patterns and imprinting, and forming inner vias connecting the inner circuit patterns positioned on different insulation layers; forming a second circuit-forming pattern on a second carrier and inserting the first circuit-forming pattern and the second circuit-forming pattern respectively into the first insulation layer and a second insulation layer on an outermost side; removing the first carrier and the second carrier; forming circuit-forming grooves by removing the first circuit-forming pattern and the second circuit-forming pattern, and forming via-forming indentations connected with the circuit-forming grooves; and forming outer circuit patterns and outer vias by filling the circuit-forming grooves and the via-forming indentations with a conductive material.

Additional aspects and advantages of the present invention will be set forth in part in the description which follows, and in part will be obvious from the description, or may be learned by practice of the invention.

DETAILED DESCRIPTION

As the invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

Figure 1:
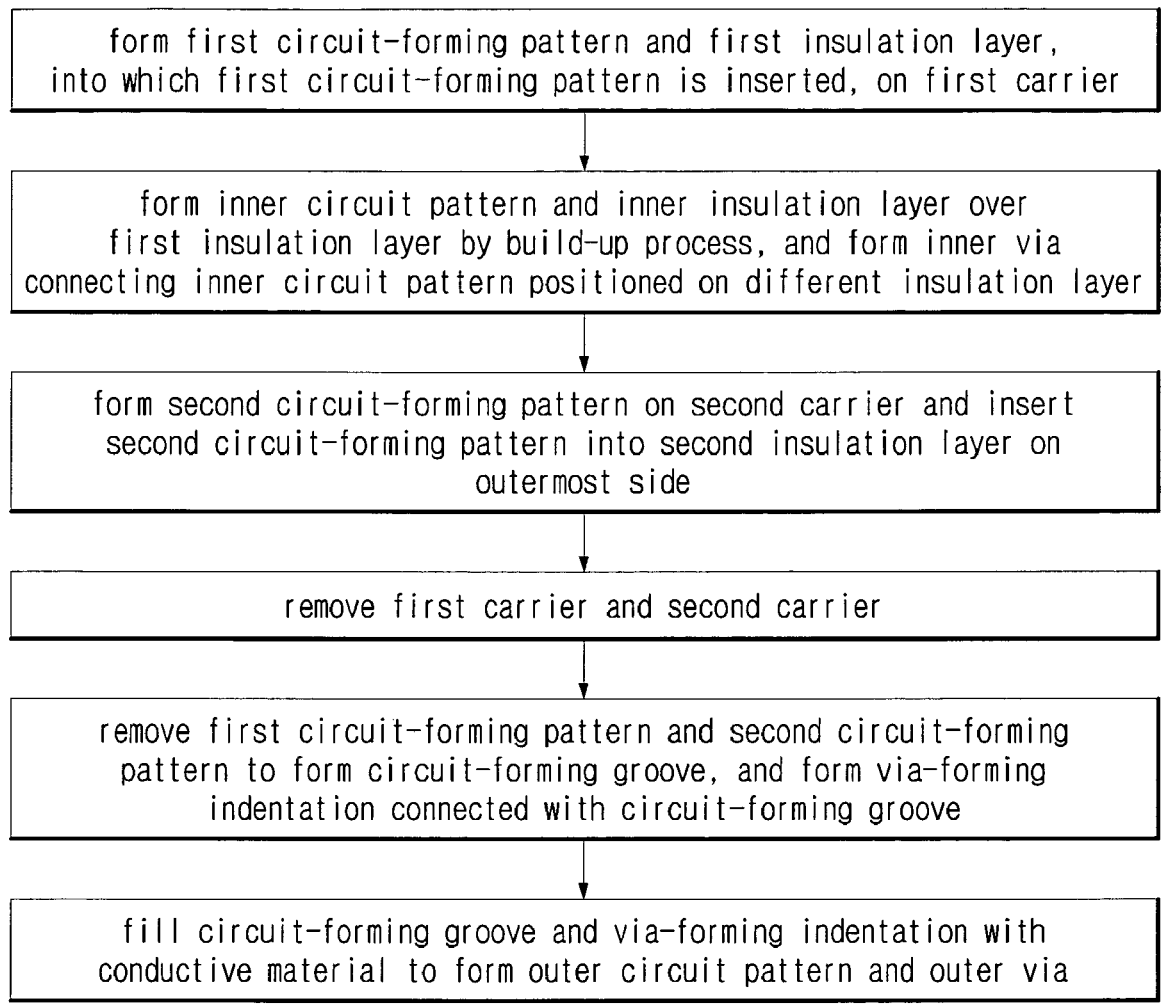
FIG. 1 is a flowchart illustrating a method of fabricating a multilayer printed circuit board according to an embodiment of the invention.

FIG. 1 is a flowchart illustrating a method of fabricating a multilayer printed circuit board according to an embodiment of the invention.

Referring to FIG. 1, a method of fabricating a multilayer printed circuit board according to an embodiment of the invention can include forming a first circuit-forming pattern and a first insulation layer, into which the first circuit-forming pattern is inserted, on a first carrier; forming inner circuit patterns and inner insulation layers over the first insulation layer by way of build-up processes, and forming inner vias that connect inner circuit patterns positioned on different inner insulation layers; forming a second circuit-forming pattern on a second carrier and iinserting the second circuit-forming pattern into a second insulation layer on an outermost side; removing the first carrier and the second carrier; forming circuit-forming grooves by removing the first circuit-forming pattern and the second circuit-forming pattern, and forming via-forming indentations connected with the circuit-forming grooves; and forming outer circuit patterns and outer vias by filling the circuit-forming grooves and the via-forming indentations with a conductive material.

In the method of fabricating a multilayer printed circuit board according to this embodiment, the first and second circuit-forming patterns may be formed respectively on the first and second carriers, inserted into insulation layers and then removed, after which a conductive material may be filled in the resultant circuit-forming grooves to form the outer circuit patterns. This will make it possible not only to fabricate a thin printed circuit board but also to increase the reliability of the board. Also, since the first and second carriers can be formed not only from metal but also from other materials such as tape, film, and sheets, the fabrication costs may be reduced.

An example of a method of fabricating a multilayer printed circuit board according to an embodiment of the invention will now be described with reference to FIG. 2 through FIG. 12.

Figure 2:
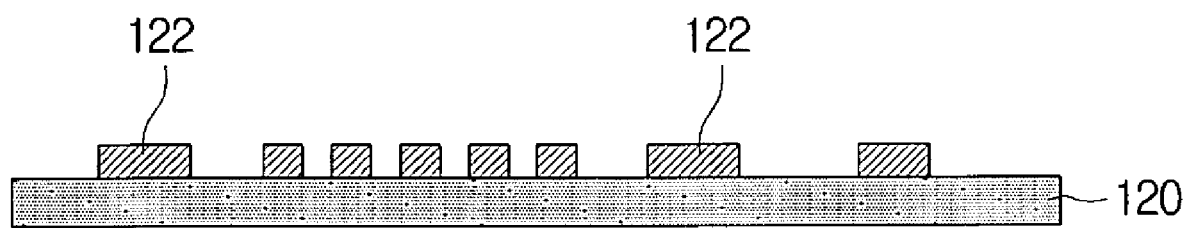
FIG. 2, FIG. 3, FIG. 4, FIG. 5, FIG. 6A, FIG. 6B, FIG. 7, FIG. 8, FIG. 9, FIG. 10, FIG. 11, and FIG. 12 are cross-sectional views representing a method of fabricating a multilayer printed circuit board according to an embodiment of the invention.

FIG. 2 is a cross-sectional view illustrating a first circuit-forming pattern 122 formed on a first carrier 120, in a method of fabricating a multilayer printed circuit board according to an embodiment of the invention.

The first carrier 120 can be made not only of a metal foil, but also of various other materials such as a tape, film, or sheet. The first carrier 120 may be removed in a subsequent process (see FIG. 8), where the method of removal may vary in accordance to the material of the first carrier 120. That is, if the first carrier 120 is formed from a metal foil, the first carrier 120 may be removed by etching, and if the first carrier 120 is formed from a tape, film, or sheet, the first carrier 120 may be peeled off.

The first circuit-forming pattern 122 formed on the first carrier 120 can be formed from a dissolvable material. For example, the first circuit-forming pattern 122 may be formed from a water-soluble resin, etc., such as modified alkyd resin, phenol resin, melamine-modified acrylic resin, and amino resin, etc. The first circuit-forming pattern 122 may also be formed from a peelable photosensitive resist.

Afterwards, the first circuit-forming pattern 122 can be dissolved or detached in a subsequent process (see FIG. 9) to form circuit-forming grooves, which can be used to form an outer circuit pattern. The method of forming the first circuit-forming pattern 122 on the first carrier 120 may be substantially the same as the general method of forming a circuit pattern on a printed circuit board, and thus will not be presented in further detail.

Figure 3:
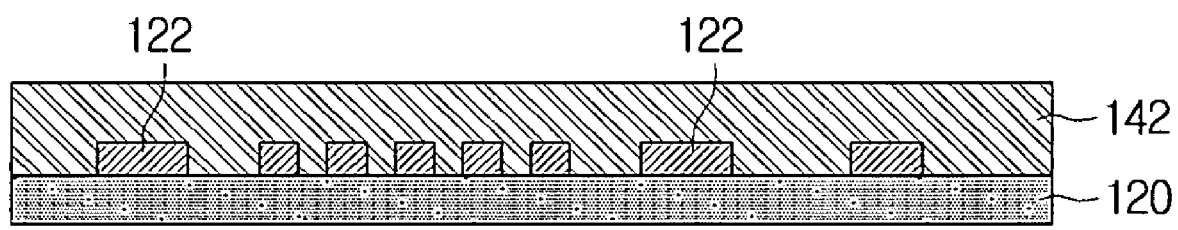

FIG. 3 is a cross-sectional view illustrating a first insulation layer 142 formed over the first circuit-forming pattern 122 illustrated in FIG. 2.

As illustrated in FIG. 3, the first insulation layer 142 can be formed on the first carrier 120 with the first circuit-forming pattern 122 inserted therein. The first insulation layer 142 may serve to insulate the layers of inner circuit patterns and outer circuit patterns, which will be formed later. An outer circuit pattern 220, formed in the grooves remaining when the first circuit-forming pattern 122 is removed, may be inserted inside the first insulation layer 142.

The first insulation layer 142 can be formed from a thermosetting resin. Examples of thermosetting resins include phenol resins, melanin resins, urea resins, urea resins, epoxy resins, phenoxy resins, epoxy modified polyimide resins, unsaturated polyester resins, polyimide resins, urethane resins, diallyl phthalate resins, etc. Such thermosetting resins can be used alone or in a mixed resin of two or more types.

A hardening agent can be used in the thermosetting resin, examples of which include polyphenol-based hardening agents, polyamine-based hardening agents, carboxylic acid hydrazide types, dicyan diamide, nylon salts and phosphates of imidazole type polyamine, Lewis acids and their amine chelates, etc. Such hardening agents can be used alone or in a mixture of two or more agents.

The first insulation layer 142 can be formed from a thermoplastic resin. Examples of thermosetting resins include polyether sulfone, polysulfone, polyether imide, polystyrene, polyethylene, polyallylate, polyamide-imide, polyphenylene sulfide, polyether ketone, polyoxy benzoate, polyvinyl chloride, polyvinyl acetate, polyacetal, polycarbonate, etc. Such thermoplastic resins can be used alone, or two or more resins can be used together.

Figure 4:
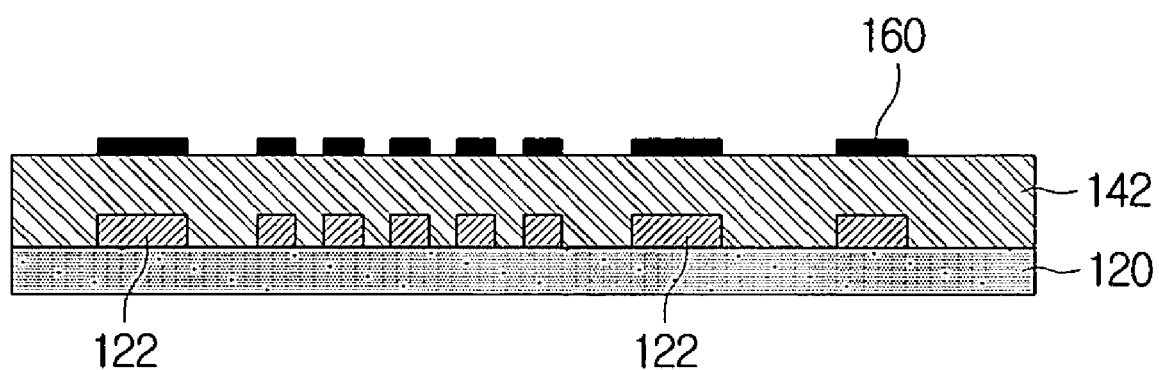
Figure 5:
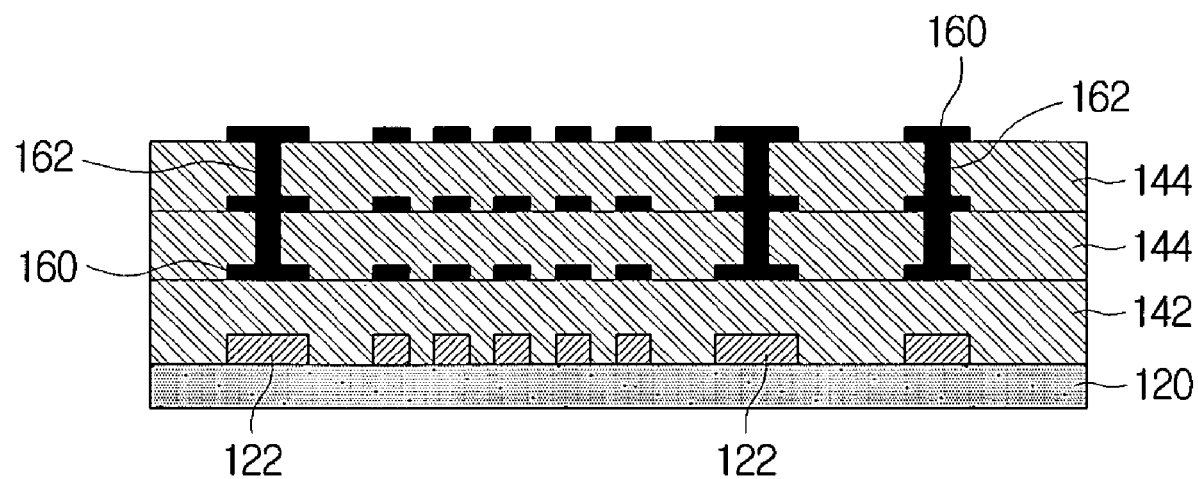

FIG. 4 and FIG. 5 are cross-sectional views illustrating inner circuit patterns 160 formed over the first insulation layer 142, in a multilayer printed circuit board according to an embodiment of the invention.

Referring to FIGS. 4 and 5, inner circuit patterns 160 and inner vias 162 may be formed over the first insulation layer 142 by build-up processes. That is, inner circuit patterns 160 can be formed by semi-additive or subtractive processes, etc., and inner vias 162 can be formed by laser processing, etc. The inner circuit patterns 160 positioned on different layers can be insulated by the inner insulation layers 144. The number of layers to which the inner insulation layers 144 are stacked may vary according to design conditions, etc. Over the inner circuit patterns of the outermost layer, a second insulation layer 146 may be formed (see FIG. 6a or FIG. 6b).

Figure 6A:
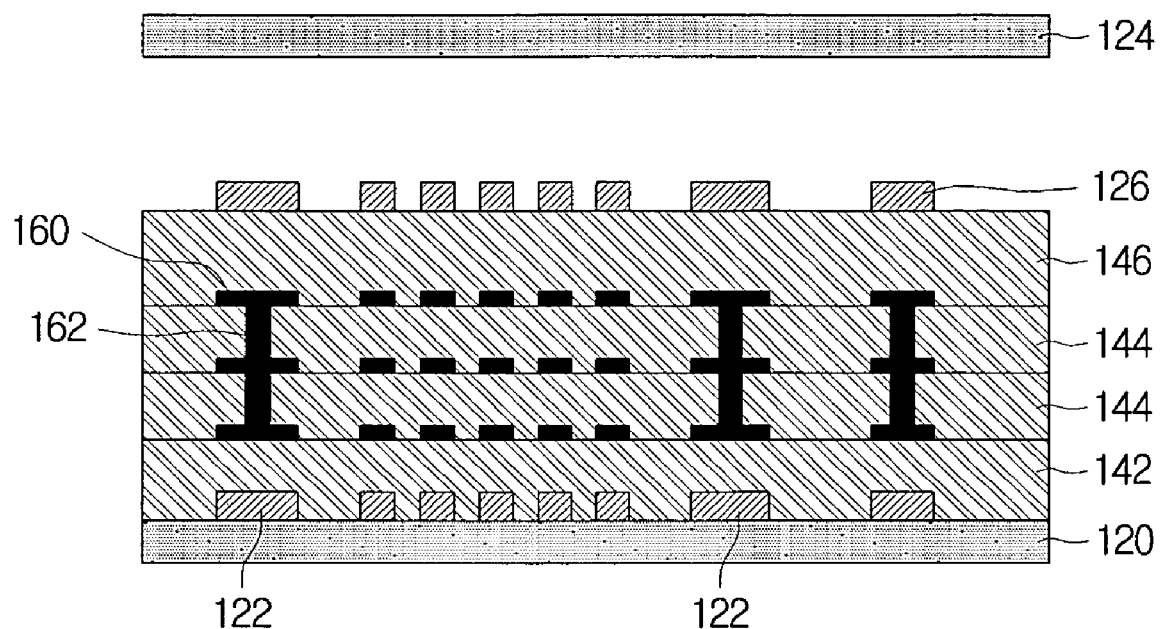

FIG. 6a is a cross-sectional view illustrating a second circuit-forming pattern 126 formed on the second insulation layer 146, in a method of fabricating a multilayer printed circuit board according to an embodiment of the invention.

Referring to FIG. 6a, the second circuit-forming pattern 126 can be formed on the second insulation layer 146 by a typical method for forming circuit patterns. The second circuit-forming pattern 126 may later be inserted into the second insulation layer 146 and then removed, to provide circuit-forming grooves for forming outer circuit patterns 220. The method of forming the second circuit-forming pattern 126, etc., may be substantially the same as the method for forming the first circuit-forming pattern 122, and thus will not be presented in further detail.

Figure 6B:
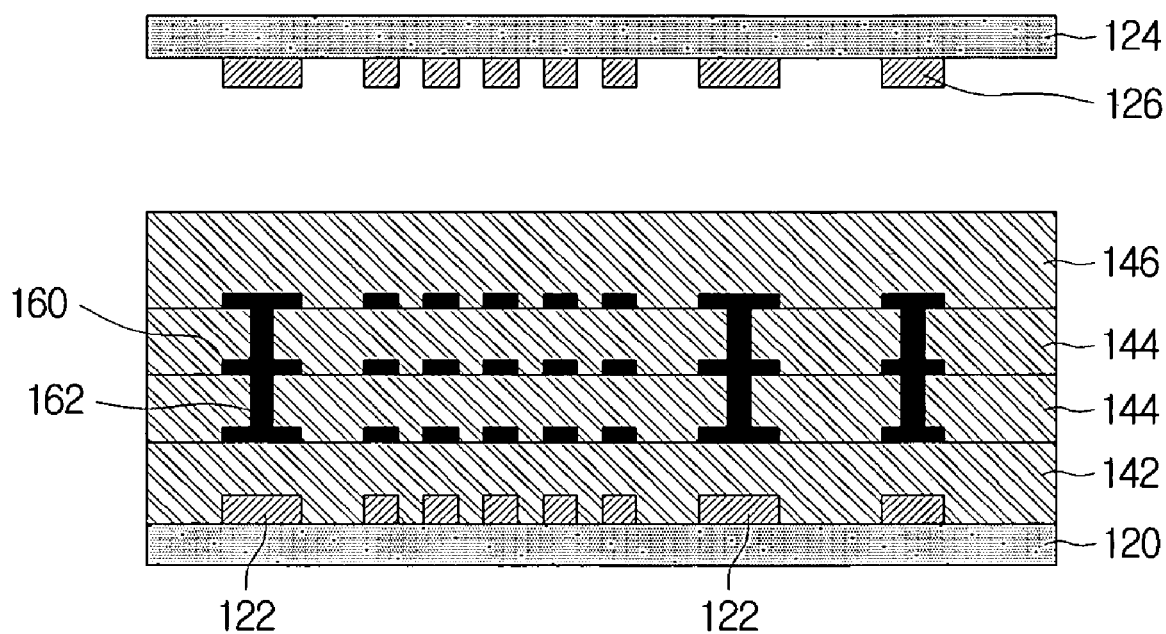

FIG. 6b is a cross-sectional view illustrating a second circuit-forming pattern 126 formed on the second insulation layer 146, in a method of fabricating a multilayer printed circuit board according to another embodiment of the invention.

Referring to FIG. 6b, the second circuit-forming pattern 126 can be formed on a second carrier 124 by a typical method for forming circuit patterns. The compositions and fabricating methods for the second carrier 124 and the second circuit-forming pattern 126 may be substantially the same as those for the first carrier 120 and the first circuit-forming pattern 122. By pressing the second carrier 124 from the outside, the second circuit-forming pattern 126 formed on the second carrier 124 can be inserted into the second insulation layer 146.

Figure 7:
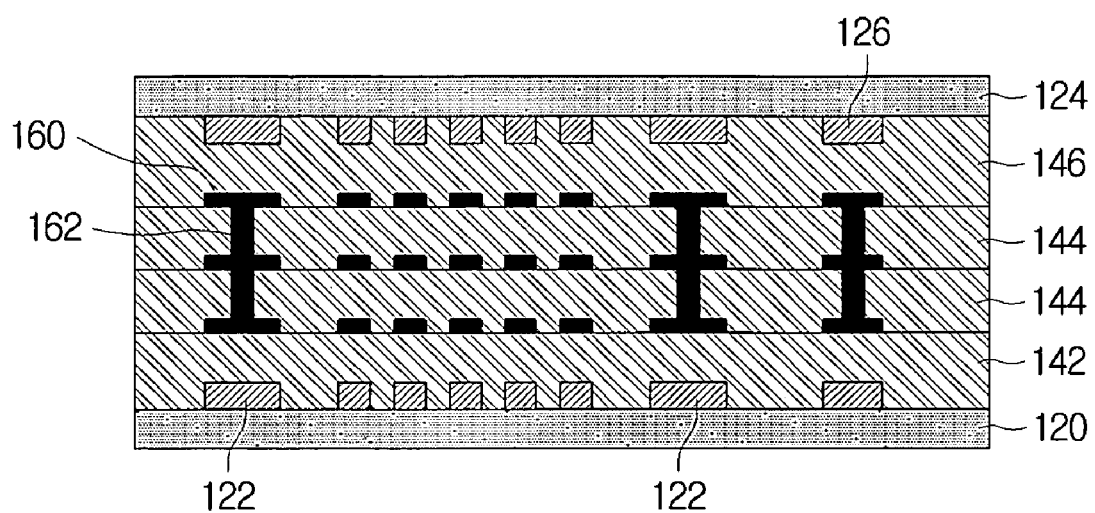

FIG. 7 is a cross-sectional view illustrating the first circuit-forming pattern 122 and second circuit-forming pattern 126 inserted into the first insulation layer 142 and second insulation layer 146 respectively, in a method of fabricating a multilayer printed circuit board according to an embodiment of the invention.

Referring to FIG. 7, the first carrier 120 and the second carrier 124, positioned on either side in FIG. 6a and FIG. 6b, may be pressed together such that the first circuit-forming pattern 122 and second circuit-forming pattern 126 are inserted inside the first insulation layer 142 and second insulation layer 146, respectively. When pressing the first and second carriers 120, 124, heat can be applied, in some cases, according to the properties of the first and second insulation layers 142, 146.

Figure 8:
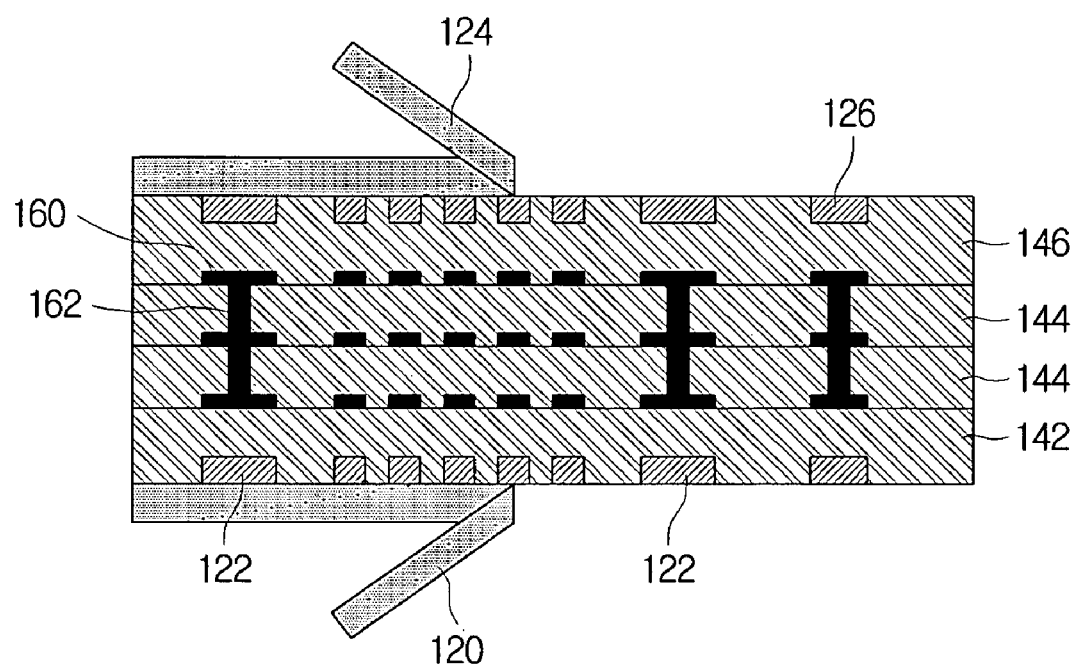

FIG. 8 is a cross-sectional view illustrating the removal of the first carrier 120 and the second carrier 124, in a method of fabricating a multilayer printed circuit board according to an embodiment of the invention.

Referring to FIG. 8, the first carrier 120 and second carrier 124 positioned on the first insulation layer 142 and second insulation layer 146 can be removed by detaching or etching. That is, if the first carrier 120 and/or second carrier 124 is made from a metal foil, etc., the first carrier 120 and/or second carrier 124 can be removed by etching, and if the first carrier 120 and/or second carrier 124 is made from a film, sheet, or tape, etc., the first carrier 120 and/or second carrier 124 can be peeled off. By removing the first and second carriers 120, 124, the first circuit-forming pattern 122 and the second circuit-forming pattern 126 may be exposed to the exterior.

Figure 9:
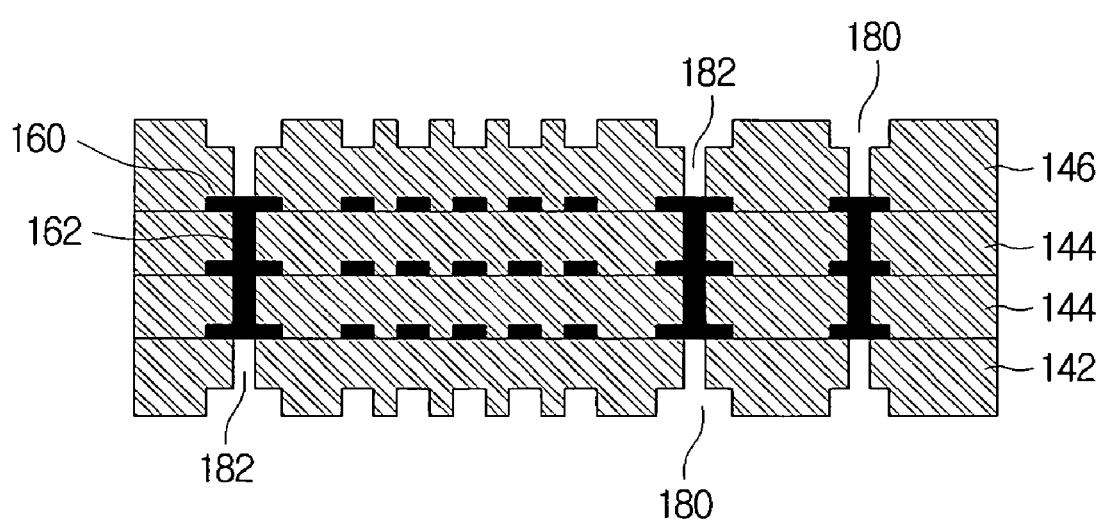

FIG. 9 is a cross-sectional view illustrating circuit-forming grooves 180 and via-forming indentations 182 formed after removing the first circuit-forming pattern 122 and second circuit-forming pattern 126, in a method of fabricating a multilayer printed circuit board according to an embodiment of the invention.

Referring to FIG. 9, the first circuit-forming pattern 122 and second circuit-forming pattern 126 may be removed, as described above, by dissolving or peeling, etc. As a result of removing the first and second circuit-forming patterns 122, 126, circuit-forming grooves 180 may be formed. In addition, via-forming indentations 182 may be formed which connect to the circuit-forming grooves 180, with the via-forming indentations 182 connecting also to the inner circuit patterns 160. The via-forming indentations 182 can be formed by laser processing, etc.

Figure 10:
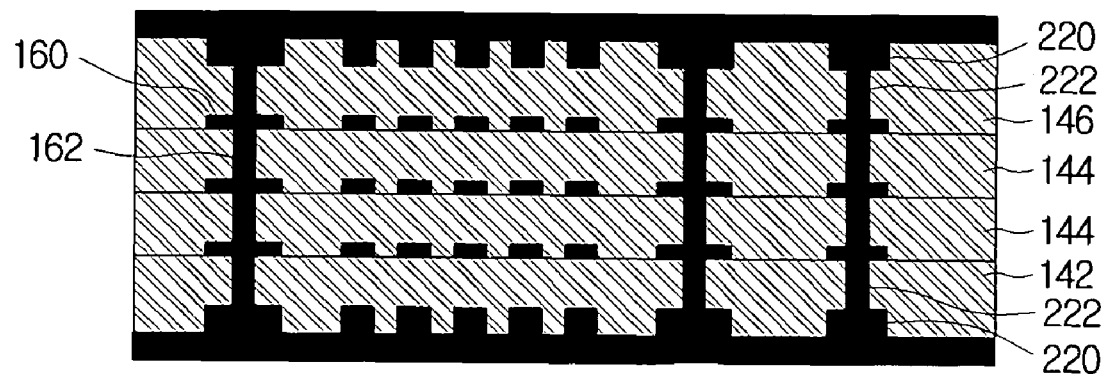

FIG. 10 is a cross-sectional view illustrating the circuit-forming grooves 180 and the via-forming indentations 182 filled in with a conductive material by performing plating, in a method of fabricating a multilayer printed circuit board according to an embodiment of the invention.

Referring to FIG. 10, the circuit-forming grooves 180 and via-forming indentations 182 can be filled in by plating with a conductive material such as copper, gold, tin, zinc, etc. The plating may be performed on just one side, or may be performed on both sides as is the case in FIG. 10. By filling in the conductive material, outer circuit patterns 220 and outer vias 222 may be formed. Interlayer connection can be provided between the inner circuit patterns 160 and outer circuit patterns 220 by the outer vias 222.

Besides performing plating, the circuit-forming grooves 180 and via-forming indentations 182 can also be filled in with conductive materials by printing metal ink, or by filling with conductive paste, to form the outer circuit patterns 220 and outer vias 222.

Figure 11:
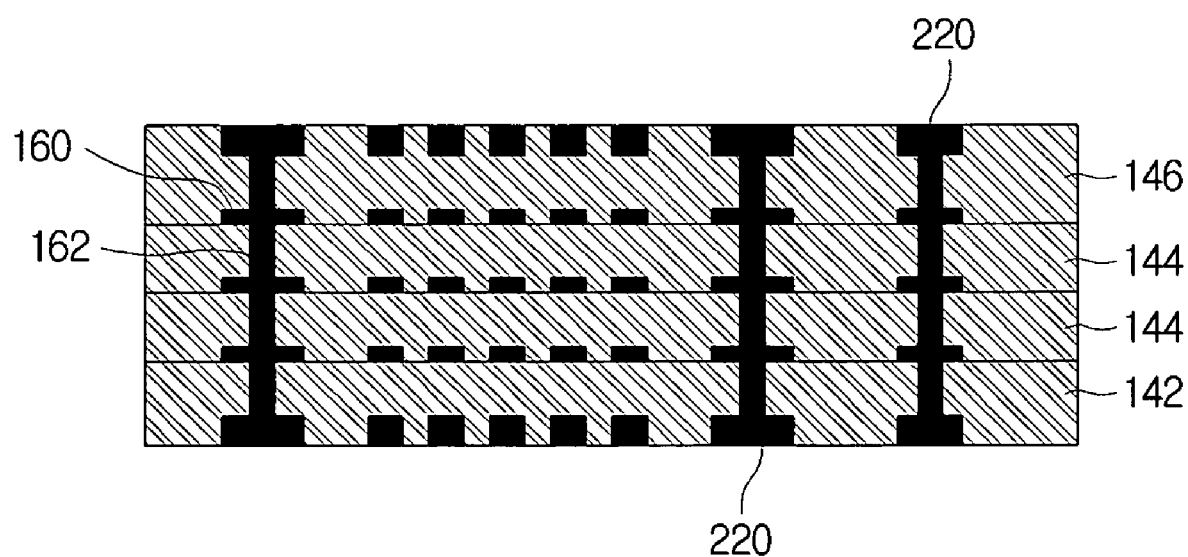

FIG. 11 is a cross-sectional view illustrating the plated board after applying a surface processing, in a method of fabricating a multilayer printed circuit board according to an embodiment of the invention.

Referring to FIG. 11, the surfaces of the layers formed by plating can be processed by methods such as mechanical polishing and etching, etc. As a result of the surface processing, the outer circuit patterns 220, and the first and second insulation layers 142, 146 may be exposed to the exterior.

Figure 12:
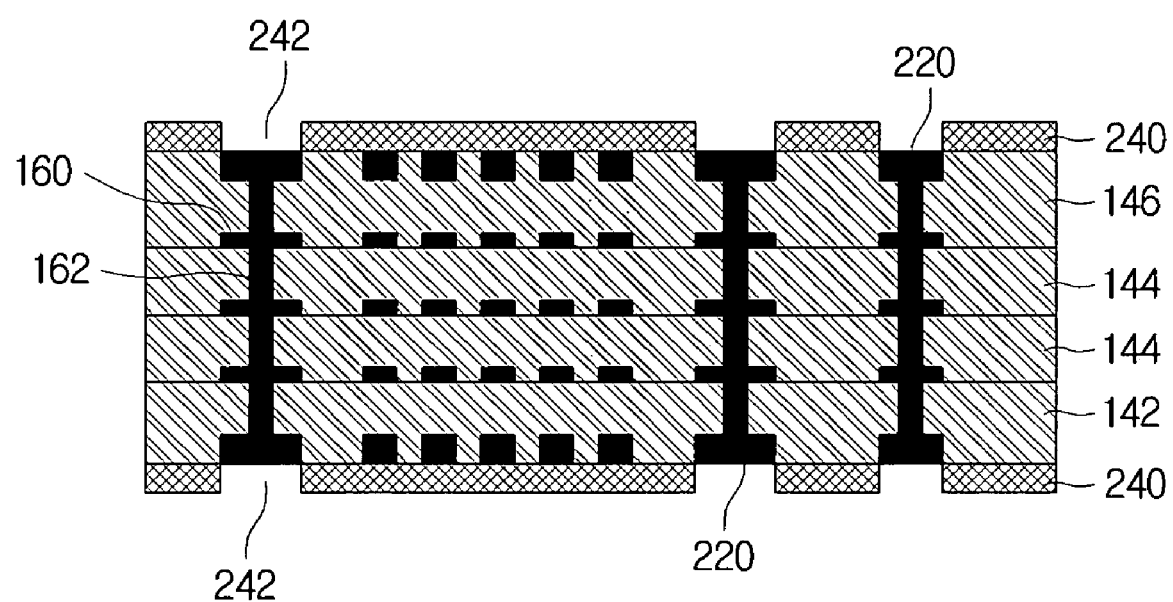

FIG. 12 is a cross-sectional view illustrating solder resists 240 formed over the first insulation layer 142 and second insulation layer 146, in a method of fabricating a multilayer printed circuit board according to an embodiment of the invention.

Referring to FIG. 12, the solder resists 240 may be formed over the first and second insulation layers. 142, 146. Openings 242 may be formed in the solder resists 240, through which the outer circuit patterns 220 can be exposed to the exterior. With the openings 242 formed in the board, a semiconductor chip (not shown), etc., can be mounted onto the board in a subsequent process.

Figure 13:
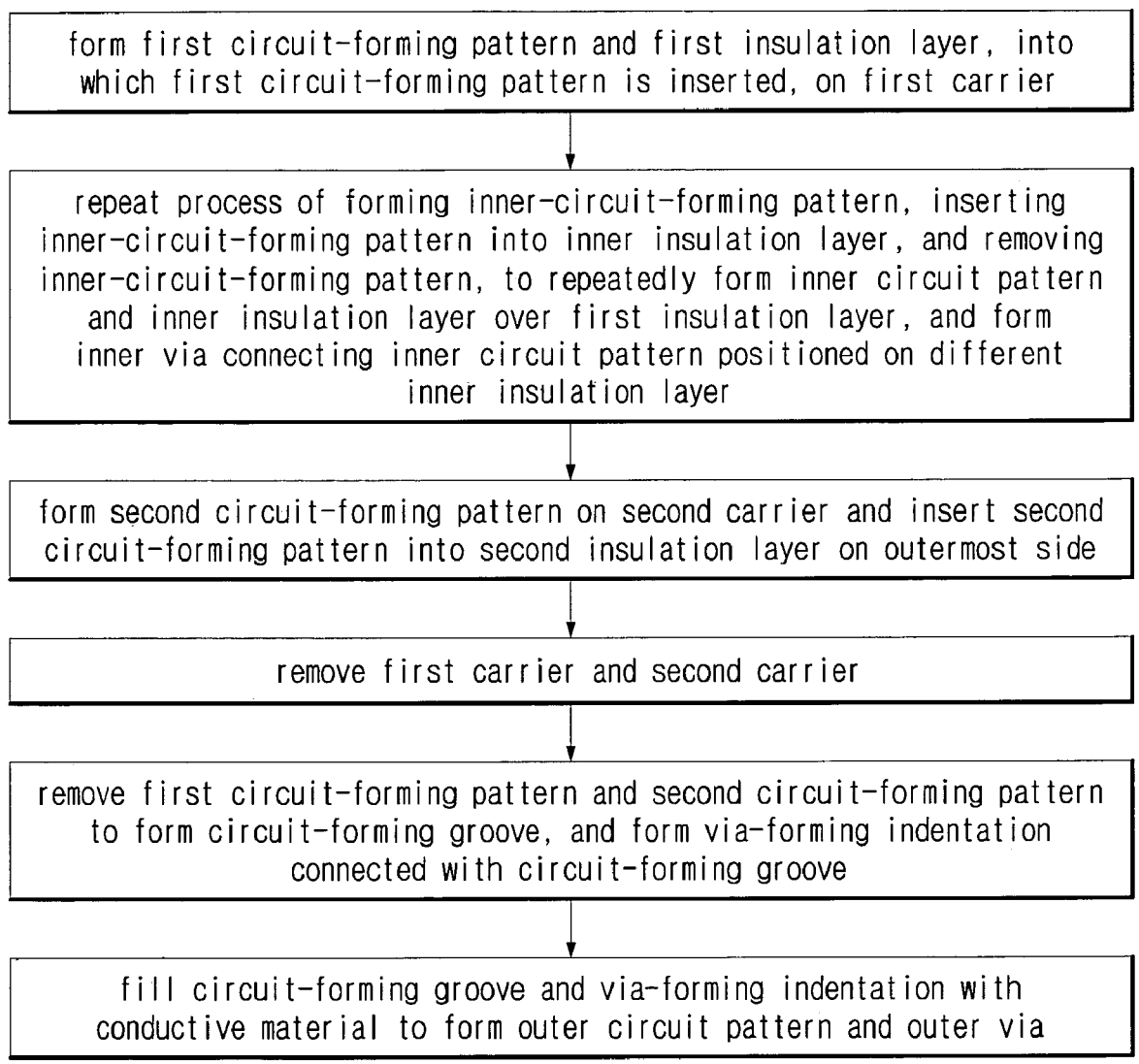
FIG. 13 is a flowchart illustrating a method of fabricating a multilayer printed circuit board according to another embodiment of the invention.

FIG. 13 is a flowchart illustrating a method of fabricating a multilayer printed circuit board according to another embodiment of the invention.

Referring to FIG. 13, a method of fabricating a multilayer printed circuit board according to another embodiment of the invention can include forming a first circuit-forming pattern and a first insulation layer, into which the first circuit-forming pattern is inserted, on a first carrier; repeatedly forming inner circuit patterns and inner insulation layers over the first insulation layer, by repeating those processes in which inner-circuit-forming patterns are formed, inserted into the inner insulation layers, and then removed, and forming inner vias that connect inner circuit patterns positioned on different inner insulation layers; forming a second circuit-forming pattern on a second carrier and inserting the second circuit-forming pattern into the second insulation layer on an outermost side; removing the first carrier and the second carrier; forming circuit-forming grooves by removing the first circuit-forming pattern and the second circuit-forming pattern, and forming via-forming indentations connected with the circuit-forming grooves; and forming outer circuit patterns and outer vias by filling the circuit-forming grooves and the via-forming indentations with a conductive material.

In the method of fabricating a multilayer printed circuit board according to this embodiment, almost all of the operations besides the method of forming the inner circuit patterns may be substantially the same as or may be in correspondence with the operations illustrated in FIG. 1. Therefore, the following descriptions will deal only with the method of forming the inner circuit patterns, with reference to FIGS. 14 to 18.

Figure 14:
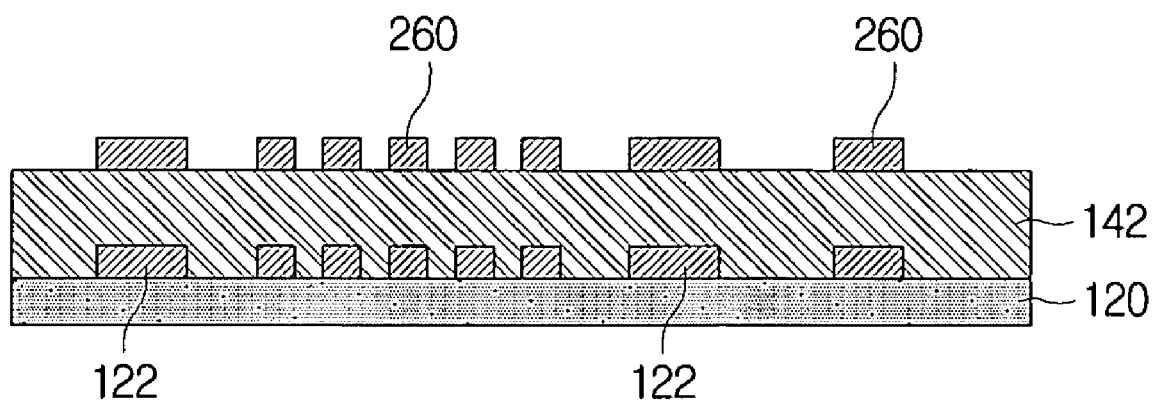
FIG. 14, FIG. 15, FIG. 16, FIG. 17, and FIG. 18 are cross-sectional views representing a method of fabricating a multilayer printed circuit board according to another embodiment of the invention.

FIG. 14 is a cross-sectional view illustrating an inner-circuit-forming pattern 260 formed on a first insulation layer 142, in a method of fabricating a multilayer printed circuit board according to another embodiment of the invention.

Referring to FIG. 14, the inner-circuit-forming pattern 260 can be formed from a dissolvable water-soluble resin or a detachable photosensitive resin, etc. The method of forming the inner-circuit-forming pattern 260 is substantially the same as that for the first circuit-forming pattern 122 positioned on the first carrier 120, and thus will not be presented in further detail.

Figure 15:
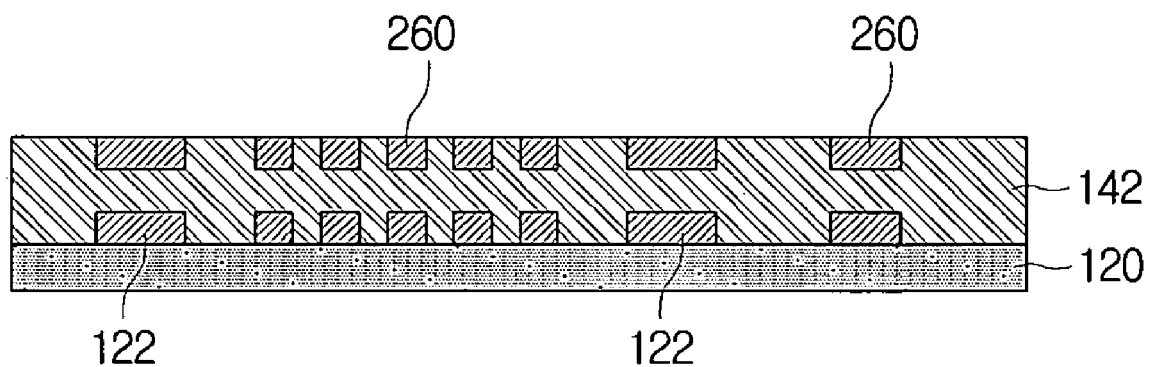

FIG. 15 is a cross-sectional view illustrating the inner-circuit-forming pattern 260 pressed and inserted into the first insulation layer 142, in a method of fabricating a multilayer printed circuit board according to another embodiment of the invention.

Referring to FIG. 15, the inner-circuit-forming pattern 260 can be pressed by a plate (not shown), etc., to be inserted into the first insulation layer 142. As described above, the method of inserting the inner-circuit-forming patterns 260 into the first insulation layer 142 may be substantially the same as the method for inserting the second circuit-forming pattern 126 into the second insulation layer 146.

Figure 16:
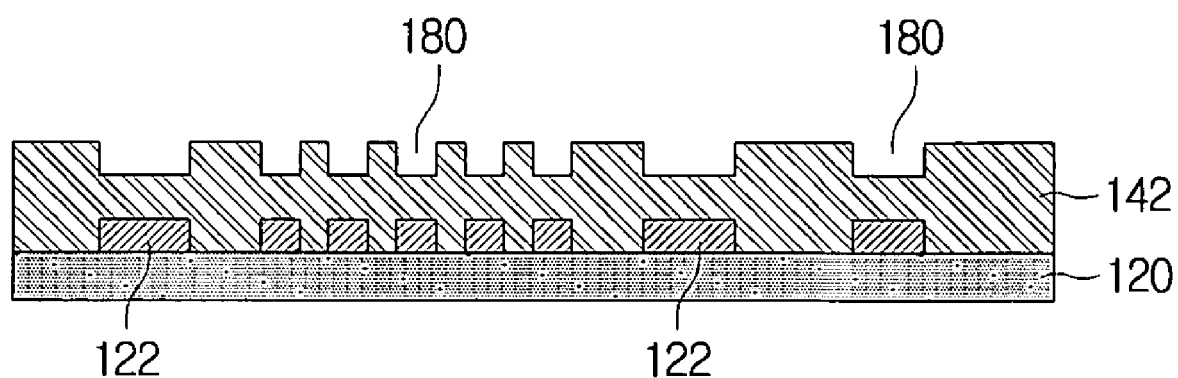

FIG. 16 is a cross-sectional view illustrating the arrangement after the inner-circuit-forming pattern 260 has been removed, in a method of fabricating a multilayer printed circuit board according to another embodiment of the invention.

Referring to FIG. 16, the inner-circuit-forming pattern 262 may be removed by peeling or dissolving, to provide circuit-forming grooves 180. As described above, if the inner-circuit-forming pattern 260 is formed from a water-soluble resin, etc., it can be removed by dissolving, and if it is formed from a detachable photosensitive resin, etc., it can be removed by peeling. Once the inner-circuit-forming pattern 260 is removed, the circuit-forming grooves 180 may be formed, by the use of which inner circuit patterns 160 can be formed.

Figure 17:
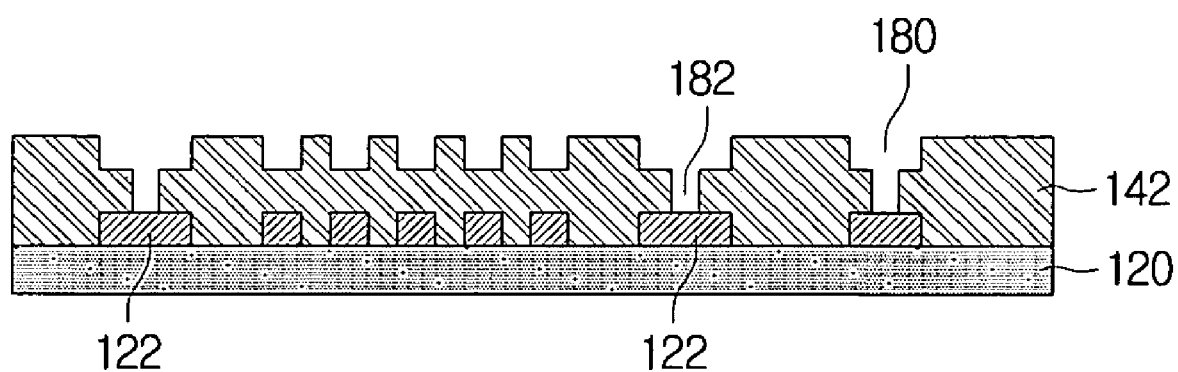

FIG. 17 is a cross-sectional view illustrating via-forming indentations 182 processed in, after removing the inner-circuit-forming pattern 260, in a method of fabricating a multilayer printed circuit board according to another embodiment of the invention.

Referring to FIG. 17, the via-forming indentations 182 can be formed by laser processing, etc., which connect with the first circuit-forming pattern 122 formed on the first carrier 120. A conductive material such as copper, etc., can be filled in the via-forming indentations 182, which allow interlayer connection between the inner circuit patterns 160 and the first circuit-forming pattern 122.

Figure 18:
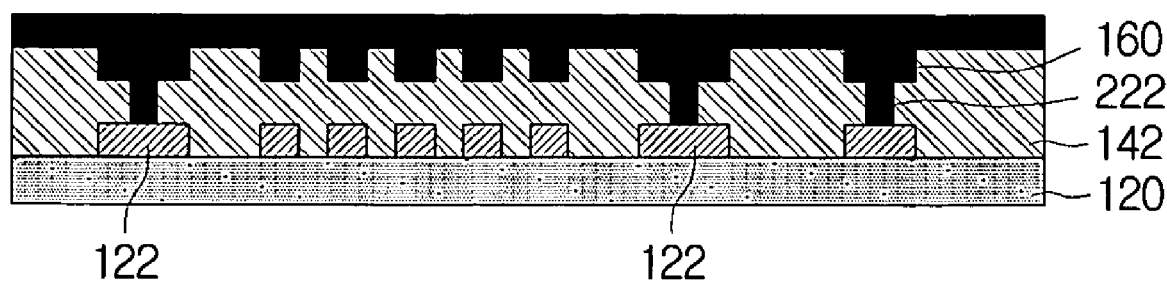

FIG. 18 is a cross-sectional view illustrating an inner circuit pattern 160 and inner vias 162 formed, in a method of fabricating a multilayer printed circuit board according to another embodiment of the invention.

Referring to FIG. 18, a conductive material can be filled by plating into the circuit-forming grooves 180 and via-forming indentations 182 formed after removing the inner-circuit-forming pattern 260. The conductive material can be filled in using a general plating process, or can be filled in by printing conductive ink. The conductive material can also be filled in using conductive paste.

In this way, a surface processing can be performed after filling in the conductive material, to expose the inner circuit pattern 160 to the exterior. Afterwards, these processes may be repeated to form inner circuit patterns 160 positioned on more layers, and then the processes illustrated in FIG. 6a or FIG. 6b through FIG. 12 can be performed to complete a multilayer printed circuit board.

Figure 19:
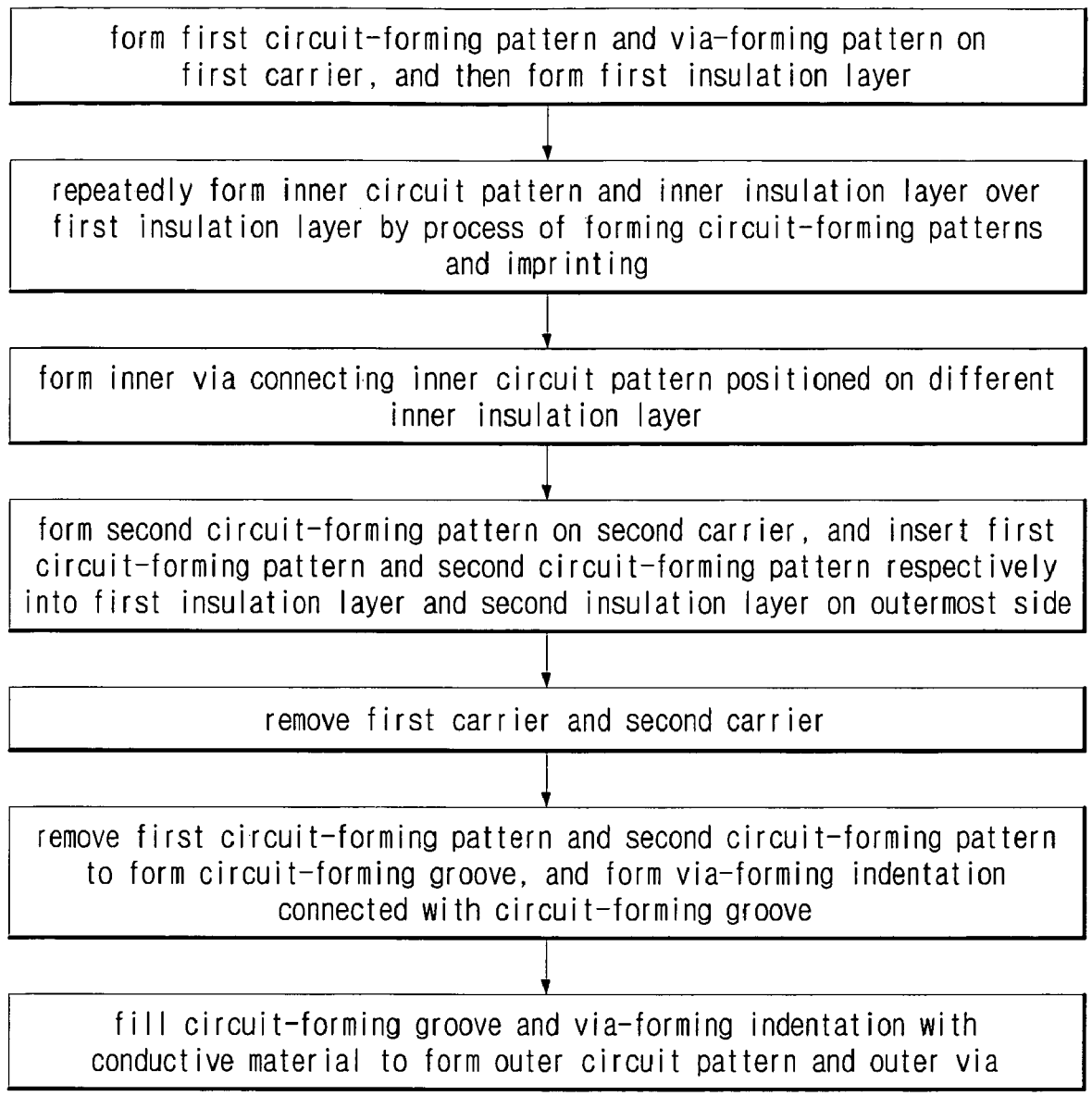
FIG. 19 is a flowchart illustrating a method of fabricating a multilayer printed circuit board according to still another embodiment of the invention.

FIG. 19 is a flowchart illustrating a method of fabricating a multilayer printed circuit board according to still another embodiment of the invention.

Referring to FIG. 19, a method of fabricating a multilayer printed circuit board according to still another embodiment of the invention can include forming a first circuit-forming pattern and a via-forming pattern on a first carrier, and then forming a first insulation layer; repeatedly forming inner circuit patterns and inner insulation layers over the first insulation layer, by processes of forming circuit-forming patterns and imprinting, and forming inner vias that connect inner circuit patterns positioned on different inner insulation layers; forming a second circuit-forming pattern on a second carrier and inserting the first circuit-forming pattern and the second circuit-forming pattern respectively into the first insulation layer and the second insulation layer on the outermost sides; removing the first carrier and the second carrier; forming circuit-forming grooves by removing the first circuit-forming pattern and the second circuit-forming pattern, and forming via-forming indentations connected with the circuit-forming grooves; and forming outer circuit patterns and outer vias by filling the circuit-forming grooves and the via-forming indentations with a conductive material.

In the method of fabricating a multilayer printed circuit board illustrated in FIG. 19, the vias that connect the outer circuit patterns 220 with the inner circuit patterns 160 may be formed by imprinting and removing the via-forming pattern 128, and then filling in a conductive material into the removed portions.

An example of a method of fabricating a multilayer printed circuit board according to still another embodiment of the invention will now be described with reference to FIG. 20 through FIG. 25.

Figure 20:
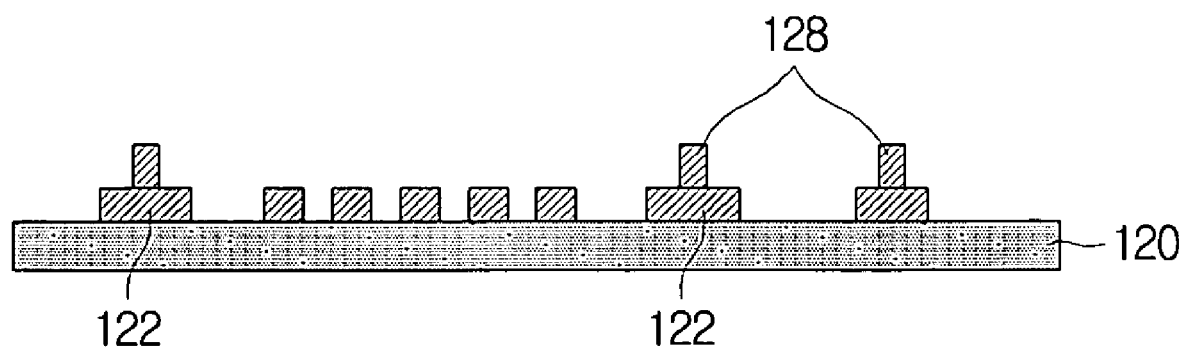
FIG. 20, FIG. 21, FIG. 22, FIG. 23, FIG. 24, and FIG. 25 are cross-sectional views representing a method of fabricating a multilayer printed circuit board according to still another embodiment of the invention.

FIG. 20 is a cross-sectional view illustrating a first circuit-forming pattern 122 and a via-forming pattern 128 formed in order over a first carrier 120, in a method of fabricating a multilayer printed circuit board according to still another embodiment of the invention.

Referring to FIG. 20, the via-forming pattern 128 may be formed by a substantially same method as that used for the first circuit-forming pattern 122. The via-forming pattern 128 can be made with a relatively smaller size than that of the first circuit-forming pattern 122. The via-forming pattern 128 may be removed in a subsequent process by a method of dissolving or detaching, similar to the method of removing the first circuit-forming pattern 122.

Figure 21:
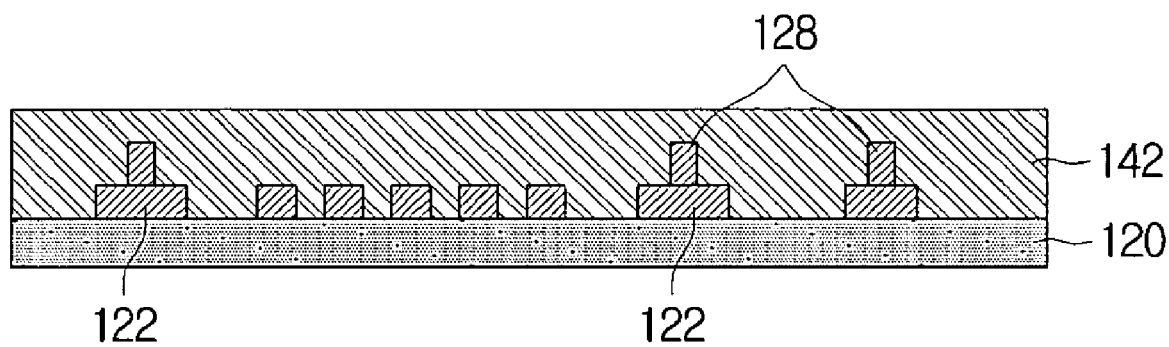

FIG. 21 is a cross-sectional view illustrating a first insulation layer 142 formed over the first carrier 120, in a method of fabricating a multilayer printed circuit board according to still another embodiment of the invention.

Referring to FIG. 21, the first circuit-forming pattern 122 and the via-forming pattern 128 can be inserted and positioned within the first insulation layer 142. The thickness of the first insulation layer 142 can be formed to be somewhat greater than the height of the via-forming pattern 128.

Figure 22:
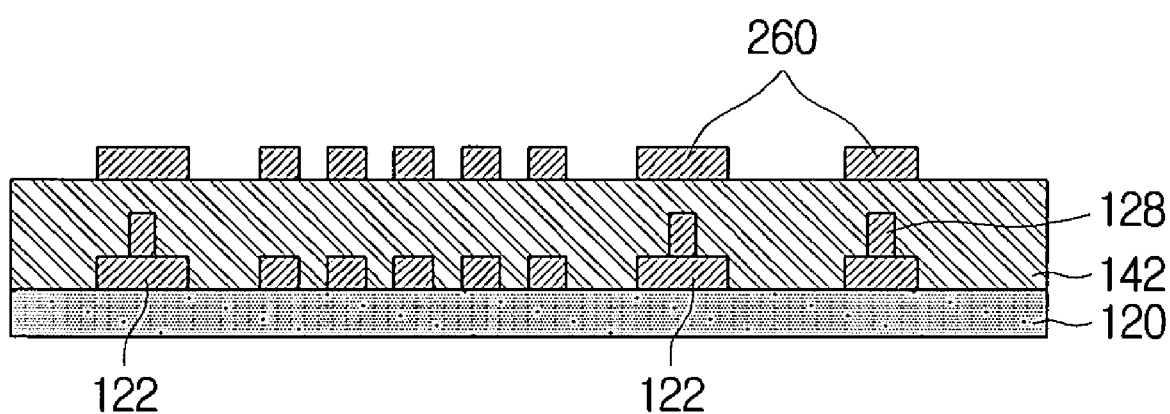

FIG. 22 is a cross-sectional view illustrating an inner-circuit-forming pattern 260 formed on the first insulation layer 142 to form an inner circuit pattern, in a method of fabricating a multilayer printed circuit board according to still another embodiment of the invention.

Referring to FIG. 22, the inner-circuit-forming pattern 260 may be formed on the first insulation layer 142. The method of forming the inner-circuit-forming pattern 260 is as described with reference to FIG. 14. The inner-circuit-forming pattern 260 may be connected with the via-forming pattern 128 in a subsequent process.

Figure 23:
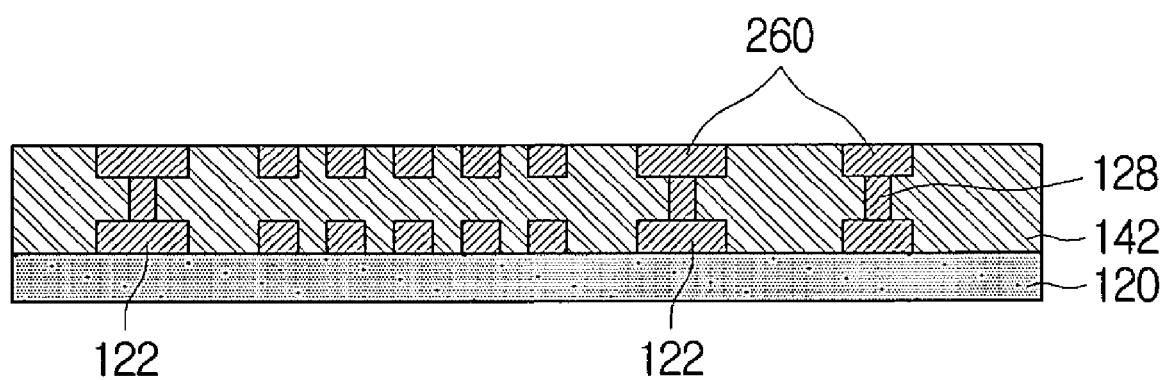

FIG. 23 is a cross-sectional view illustrating the inner-circuit-forming pattern 260 pressed and inserted into the first insulation layer 142, in a method of fabricating a multilayer printed circuit board according to still another embodiment of the invention.

Referring to FIG. 23, the inner-circuit-forming pattern 260 may be pressed and inserted inside the first insulation layer 142. Here, portions of the first circuit-forming pattern 122 may be placed in contact with the via-forming pattern 128.

Figure 24:
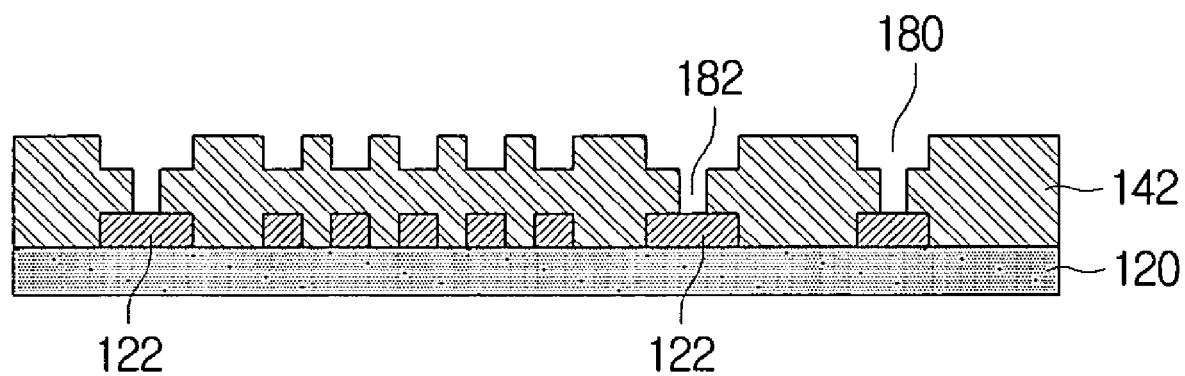

FIG. 24 is a cross-sectional view after the inner-circuit-forming pattern 260 and the via-forming pattern 128, in a method of fabricating a multilayer printed circuit board according to still another embodiment of the invention.

Referring to FIG. 24, the inner-circuit-forming pattern 260 and via-forming pattern 128 may be removed by dissolving or peeling, etc., to form circuit-forming grooves 180 and via-forming indentations 182. Through the circuit-forming grooves 180 and via-forming indentations 182, the first circuit-forming pattern 122 formed on the first carrier 120 may be exposed to the exterior. As resin, etc., may remain on the exposed first circuit-forming pattern 122, a plasma or chemical desmearing process may be performed to treat the first circuit-forming pattern 122 for resin residue, etc.

Figure 25:
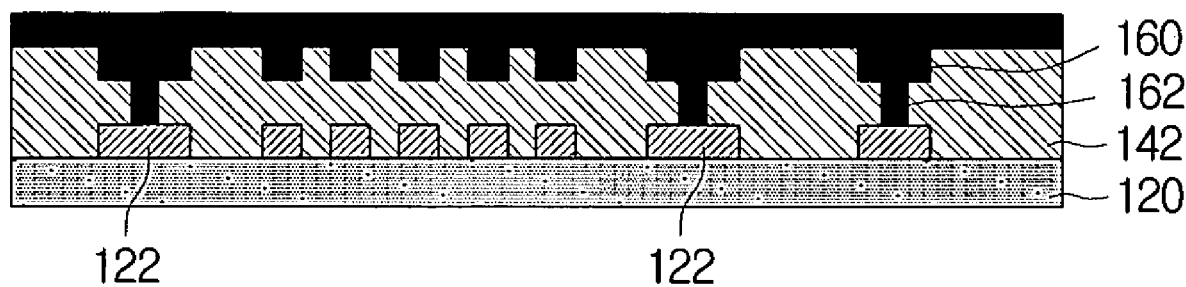

FIG. 25 is a cross-sectional view illustrating the circuit-forming grooves 180 and via-forming indentations 182 filled with conductive material, in a method of fabricating a multilayer printed circuit board according to still another embodiment of the invention.

Referring to FIG. 25, the circuit-forming grooves 180 and the via-forming indentations 182 can be filled with conductive material by a process of plating, etc. As a result, an inner circuit pattern 160 and inner vias 162 may be formed. Then, the first circuit-forming pattern 122 touching the outer vias 222 may be removed in a subsequent process, and conductive material can be filled into the resulting grooves to form an outer circuit pattern 220 that connects with the outer vias 222.

Although this particular embodiment is described to have the inner circuit patterns formed by forming, imprinting, and removing the inner-circuit-forming patterns 260, and then filling with conductive material, the embodiment is not thus limited, and it is apparent that the inner circuit patterns can be formed by build-up processes as illustrated in FIGS. 3 to 4.

Figure 26:
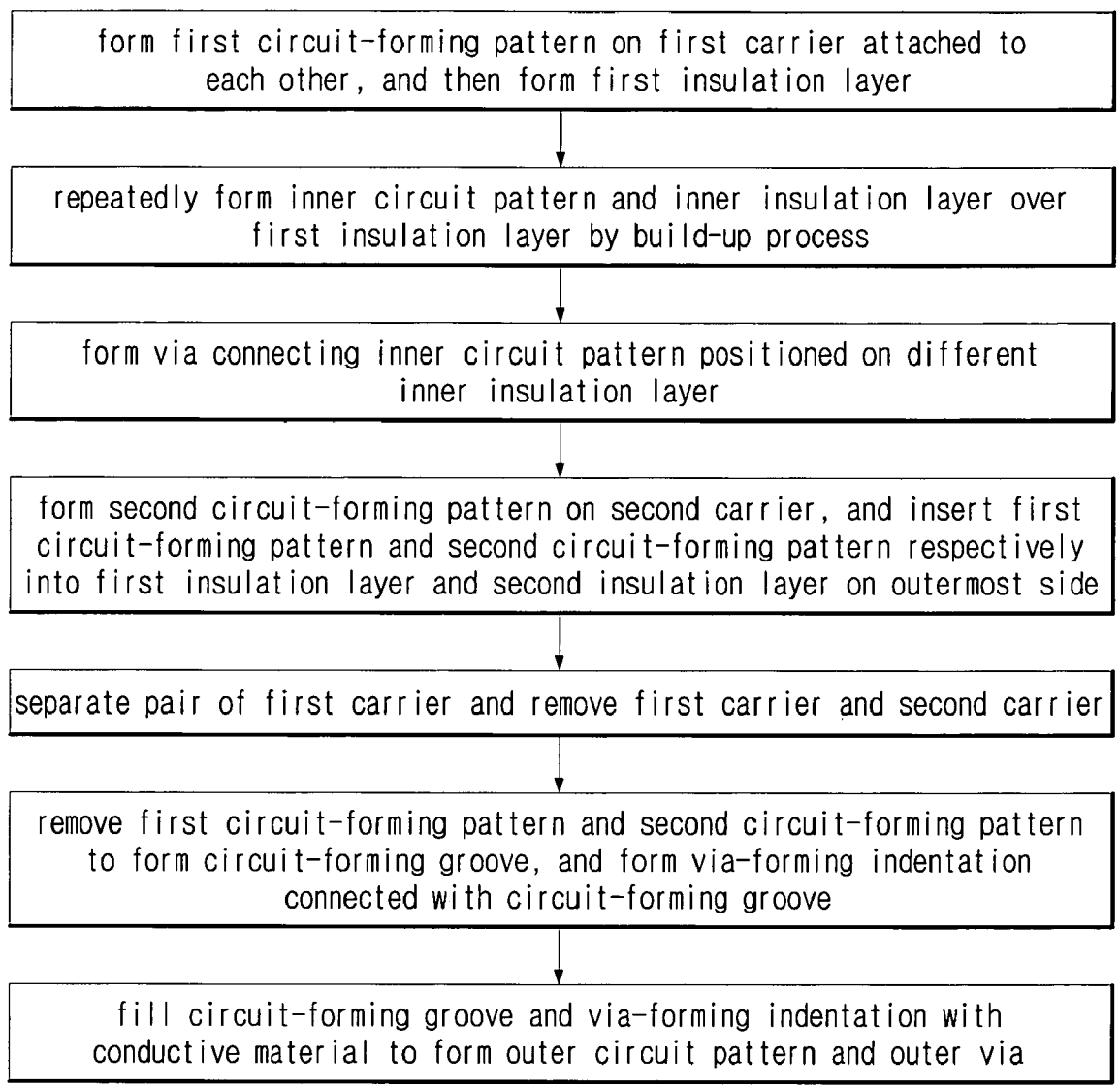
FIG. 26 is a flowchart illustrating a method of fabricating a multilayer printed circuit board according to yet another embodiment of the invention.

FIG. 26 is a flowchart illustrating a method of fabricating a multilayer printed circuit board according to yet another embodiment of the invention.

Referring to FIG. 26, a method of fabricating a multilayer printed circuit board according to yet another embodiment of the invention can include forming a first circuit-forming pattern on each of first carriers that are attached to each other, and then forming a first insulation layer; repeatedly forming inner circuit patterns and inner insulation layers over the first insulation layers by way of build-up processes, and forming vias that connect inner circuit patterns positioned on different inner insulation layers; forming second circuit-forming patterns on second carriers and inserting the first circuit-forming patterns and the second circuit-forming patterns into the first insulation layers and the second insulation layers on the outermost sides; separating the pair of first carriers and removing the first carriers and the second carriers; forming circuit-forming grooves by removing the first circuit-forming patterns and the second circuit-forming patterns, and forming via-forming indentations connected with the circuit-forming grooves; and forming outer circuit patterns and outer vias by filling the circuit-forming grooves and the via-forming indentations with conductive material.

Figure 27:
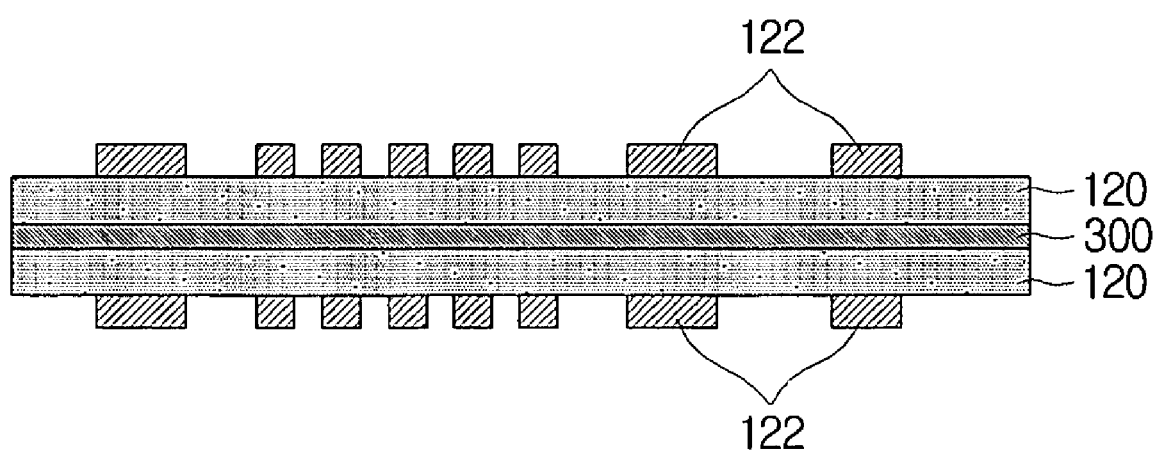
FIG. 27 and FIG. 28 are cross-sectional views representing a method of fabricating a multilayer printed circuit board according to yet another embodiment of the invention.

In the method of fabricating a multilayer printed circuit board according to this embodiment, a pair of first carriers 120 may be attached to each other, as illustrated in FIG. 27, after which the processes illustrated in FIG. 2 through FIG. 7 may be performed for each first carrier 120. As the processes illustrated in FIGS. 8 to 12 may be performed after separating the adjoined first carriers 120, the process times may be reduced.

FIG. 27 is a cross-sectional view illustrating a pair of first carriers 120 attached to each other, in a method of fabricating a multilayer printed circuit board according to yet another embodiment of the invention.

Referring to FIG. 27, the first carriers 120 may be joined by an adhesive film 300 such that they are detachable, so that they may be separated in a subsequent process. Each of the first carriers 120 may have a first circuit-forming pattern 122 formed thereon.

Figure 28:
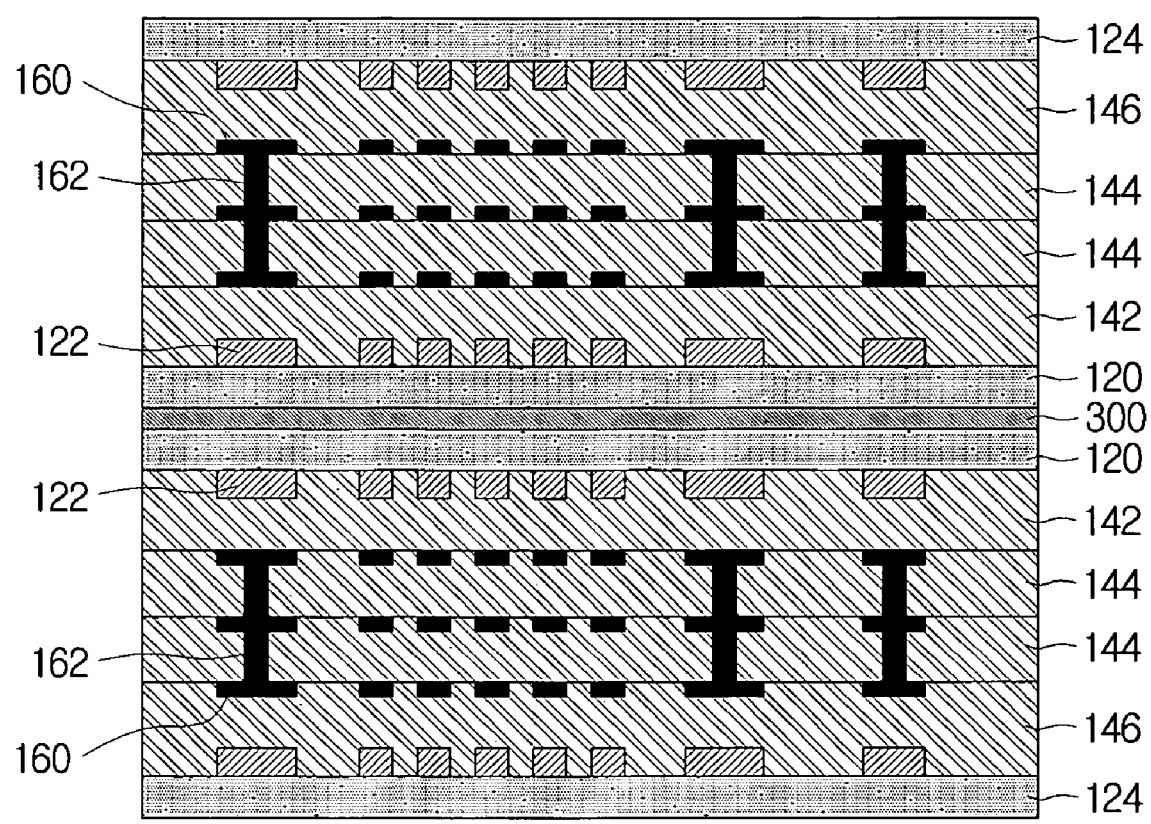

FIG. 28 is a cross-sectional view illustrating inner circuit patterns 160 and inner vias 162 formed over the pair of first carriers 120 by build-up processes or imprinting processes, in a method of fabricating a multilayer printed circuit board according to yet another embodiment of the invention.

Referring to FIG. 28, it can be observed that identical circuit layers may be formed on either side of the adhesive film 300. The method of forming the circuit layers may be substantially the same as the method described with reference to FIG. 2 through FIG. 7. Then, after separating the circuit layers by removing the adhesive film 300, the processes illustrated in FIGS. 8 to 12 can be performed to fabricate the multilayer printed circuit board.

As set forth above, certain aspects of the invention provide a fabrication method for a thin multilayer printed circuit board.

Certain aspects of the invention also provide a fabrication method for a multilayer printed circuit board, which enables the forming of fine-lined circuits and provides high reliability.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of fabricating a multilayer printed circuit board, the method comprising:
    forming a first circuit-forming pattern and a first insulation layer on a first carrier, the first circuit-forming pattern inserted into the first insulation layer;
    forming inner circuit patterns and inner insulation layers over the first insulation layer, and forming inner vias connecting the inner circuit patterns positioned on different insulation layers;
    forming a second circuit-forming pattern on a second carrier and inserting the second circuit-forming pattern into a second insulation layer;
    removing the first carrier and the second carrier; forming circuit-forming grooves by removing the first circuit-forming pattern and the second circuit-forming pattern, and forming via-forming indentations connected with the circuit-forming grooves; and
    forming outer circuit patterns and outer vias by filling the circuit-forming grooves and the via-forming indentations with a conductive material.

2. The method of claim 1, wherein at least one of the first circuit-forming pattern and the second circuit-forming pattern is formed from a detachable photosensitive resist.

3. The method of claim 1, wherein forming the first circuit-forming pattern on the first carrier comprises: detachably securing a pair of the first carriers to each other and forming the first circuit-forming pattern on each of the first carriers.

4. The method of claim 1, wherein at least one of the first circuit-forming pattern and the second circuit-forming pattern is formed from a dissolvable material.

5. The method of claim 4, wherein at least one of the first circuit-forming pattern and the second circuit-forming pattern is formed from a water-soluble resin.

6. The method of claim 1, wherein at least one of the first carrier and the second carrier is removed by detaching.

7. The method of claim 6, wherein at least one of the first carrier and the second carrier is any one of a tape, a film, and a sheet.

8. The method of claim 1, wherein at least one of the first carrier and the second carrier is removed by etching.

9. The method of claim 8, wherein at least one of the first carrier and the second carrier is formed from a metal foil.

10. The method of claim 1, wherein the inner circuit patterns are formed by a set of operations comprising:
    pressing inner-circuit-forming patterns formed on the inner insulation layers, such that the inner-circuit-forming patterns are inserted into the inner insulation layers, and then removing the inner-circuit-forming patterns; and
    filling a conductive material in circuit-forming grooves formed by removing the inner-circuit-forming patterns.

11. The method of claim 10, wherein the inner vias are formed by processing via-forming indentations connected with the inner circuit patterns in the circuit-forming grooves, and then filling a conductive material in the via-forming indentations.

12. The method of claim 1, wherein the conductive material filled in the circuit-forming grooves and the via-forming indentations is filled in by plating.

13. The method of claim 12, further comprising: removing a portion of the conductive material by a leveling process, after filling the conductive material in.

14. The method of claim 13, further comprising, after the leveling process: forming a solder resist on at least one of the first insulation layer and the second insulation layer and forming openings revealing the outer circuit patterns.

15. A method of fabricating a multilayer printed circuit board, the method comprising:
    forming a first circuit-forming pattern and a first insulation layer on a carrier, the first circuit-forming pattern inserted into the first insulation layer;
    forming inner circuit patterns and inner insulation layers over the first insulation layer, and forming inner vias connecting the inner circuit patterns positioned on different insulation layers;
    forming a second circuit-forming pattern on a second insulation layer, and inserting the second circuit-forming pattern into the second insulation layer;
    removing the carrier; forming circuit-forming grooves and via-forming indentations connected with the circuit-forming grooves, by removing the first circuit-forming pattern and the second circuit-forming pattern; and
    forming outer circuit patterns and outer vias by filling the circuit-forming grooves and the via-forming indentations with a conductive material.

16. The method of claim 15, wherein at least one of the first circuit-forming pattern and the second circuit-forming pattern is formed from a detachable photosensitive resist.

17. The method of claim 15, wherein forming the first circuit-forming pattern on the carrier comprises: detachably securing a pair of the carriers to each other and forming the first circuit-forming pattern on each of the carriers.

18. The method of claim 15, wherein at least one of the first circuit-forming pattern and the second circuit-forming pattern is formed from a dissolvable material.

19. The method of claim 18, wherein at least one of the first circuit-forming pattern and the second circuit-forming pattern is formed from a water-soluble resin.

20. The method of claim 15, wherein the carrier is removed by detaching.

21. The method of claim 20, wherein the carrier is any one of a tape, a film, and a sheet.

22. The method of claim 15, wherein the carrier is removed by etching.

23. The method of claim 22, wherein the carrier is formed from a metal foil.

24. The method of claim 15, wherein the inner circuit patterns are formed by a set of operations comprising:
- pressing inner-circuit-forming patterns formed on the inner insulation layers, such that the inner-circuit-forming patterns are inserted into the inner insulation layers, and then removing the inner-circuit-forming patterns; and
- filling a conductive material in circuit-forming grooves formed by removing the inner-circuit-forming patterns.

25. The method of claim 24, wherein the inner vias are formed by processing via-forming indentations connected with the inner circuit patterns in the circuit-forming grooves, and then filling a conductive material in the via-forming indentations.

26. The method of claim 15, wherein the conductive material filled in the circuit-forming grooves and the via-forming indentations is filled in by plating.

27. The method of claim 26, further comprising: removing a portion of the conductive material by a leveling process, after filling the conductive material in.

28. The method of claim 27, further comprising, after the leveling process: forming a solder resist on at least one of the first insulation layer and the second insulation layer and forming openings revealing the outer circuit patterns.

* * * * *